United States Patent
Sharma et al.

(10) Patent No.: US 8,963,556 B2
(45) Date of Patent: Feb. 24, 2015

(54) SYSTEM AND METHOD FOR DETECTING EXCESS VOLTAGE DROP IN THREE-PHASE AC CIRCUITS

(71) Applicant: Eaton Corporation, Cleveland, OH (US)

(72) Inventors: Santosh Kumar Sharma, Maharashtra (IN); Xin Zhou, Wexford, PA (US); Steven Andrew Dimino, Wauwatosa, WI (US); Supriya Karnani, Maharashtra (IN); Snehal Kale, Maharashtra (IN); Rahul Choudhary, Pune (IN); Debsubhra Chakraborty, Pune (IN)

(73) Assignee: Eaton Corporation, Cleveland, OH (US)

( * ) Notice: Subject to any disclaimer, the term of this patent is extended or adjusted under 35 U.S.C. 154(b) by 108 days.

(21) Appl. No.: 13/873,326

(22) Filed: Apr. 30, 2013

(65) Prior Publication Data

US 2014/0320148 A1    Oct. 30, 2014

(51) Int. Cl.
*G01R 31/08* (2006.01)
*G01R 31/02* (2006.01)
*H02H 3/33* (2006.01)

(52) U.S. Cl.
CPC ............ *G01R 31/024* (2013.01); *H02H 3/33* (2013.01); *G01R 31/088* (2013.01); *G01R 31/026* (2013.01)
USPC ........... 324/522; 324/511; 324/520; 324/512; 324/521; 324/509; 361/42; 702/58; 702/59

(58) Field of Classification Search
CPC .... G01R 31/025; G01R 31/08; G01R 31/088; G01R 31/085; G01R 31/024; G01R 31/026; G01R 31/041; G01R 27/2611; B60R 21/015; B60R 2021/01088; B60R 21/01184; B60R 21/0157; H02H 1/0015; H02H 83/04; H02H 3/33; H02H 3/335; H02H 3/338; H02H 3/105; H02H 3/347
USPC ........... 324/522, 520, 511, 512, 521, 509, 86, 324/107, 108, 555; 361/42; 702/58, 59
See application file for complete search history.

(56) References Cited

U.S. PATENT DOCUMENTS 5,513,090 A    4/1996    Bhattacharya et al.
5,751,132 A *  5/1998    Horvath et al. ............... 318/798
(Continued)

FOREIGN PATENT DOCUMENTS

CN    101762743 A    6/2010
GB       858638 A    1/1961
(Continued)

OTHER PUBLICATIONS

Wang, "An Analytical Study on Steady-state Performance of an Induction Motor Connected to Unbalanced Three-phase Voltage," Dept. of Electr. Eng., Nat. Yun-Lin Univ. of Sci. & Technol., Taiwan, Power Engineering Society Winter Meeting, 2000, IEEE, pp. 159-164.

Al-Diab et al., "Unbalanced Voltage Drops Compensations Using Flywheel Energy Storage System," 2011 11th International Conference on Electrical Power Quality and Utilisation (EPQU), Res. Group for Power Syst. Technol., Ruhr-Univ. Bochum, Bochum, Germany, pp. 1-6.

(Continued)

*Primary Examiner* — Huy Q Phan
*Assistant Examiner* — Thang Le
(74) *Attorney, Agent, or Firm* — Ziolkowski Patent Solutions Group, SC

(57) ABSTRACT

A system and method for detecting excess voltage drop (EVD) in a three-phase electrical distribution circuit includes a diagnostic system comprising a processor that is programmed to receive three-phase voltages and currents provided to terminals of the electrical machine, determine fundamental components of the three-phase voltages and currents provided to the terminals, and compute positive, negative, and zero sequence currents from the fundamental components. The processor is also programmed to extract a compensated negative sequence current from the negative sequence current component, add the compensated negative sequence current to the positive sequence current to determine fault reference current phasors, determine a negative current reference phase angle for each phase based in part on a phase angle of the positive sequence current, and identify an EVD fault in the electrical distribution circuit based on the compensated negative sequence current, the fault reference current phasors, and the negative current reference phase angles.

20 Claims, 5 Drawing Sheets

(56) References Cited

U.S. PATENT DOCUMENTS

| | | | |
|---|---|---|---|
| 6,650,516 B2 * | 11/2003 | Langford et al. | 361/42 |
| 7,215,519 B2 * | 5/2007 | Blumenauer et al. | 361/42 |
| 7,345,488 B2 * | 3/2008 | Fischer | 324/521 |
| 8,094,426 B2 * | 1/2012 | Kellis et al. | 361/109 |
| 2003/0074146 A1 * | 4/2003 | Stoupis et al. | 702/58 |
| 2003/0142450 A1 * | 7/2003 | Bo | 361/62 |
| 2003/0197989 A1 * | 10/2003 | Nojima | 361/47 |
| 2005/0231871 A1 | 10/2005 | Karimi Ghartemani | |
| 2007/0041137 A1 * | 2/2007 | Thompson | 361/85 |
| 2009/0161270 A1 * | 6/2009 | Beatty et al. | 361/42 |
| 2010/0060289 A1 | 3/2010 | Wiedenbrug et al. | |
| 2011/0178741 A1 * | 7/2011 | Saha | 702/59 |
| 2012/0212191 A1 * | 8/2012 | Yuzurihara et al. | 323/205 |
| 2013/0134910 A1 * | 5/2013 | Iwashita et al. | 318/376 |

FOREIGN PATENT DOCUMENTS

| | | |
|---|---|---|
| GB | 2362275 A | 11/2001 |
| KR | 905443 B1 | 5/2007 |
| KR | 925148 | 11/2007 |
| KR | 2011096828 | 2/2010 |

OTHER PUBLICATIONS

Chindris et al., "Propagation of Unbalance in Electric Power Systems," 9th International Conference, Electrical Power Quality and Utilisation, Barcelona, Oct. 9-11, 2007, pp. 1-5.

Yun et al., "Online Detection of High-Resistance Connections in the Incoming Electrical Circuit for Induction Motors," IEEE Transactions on Industry Applications, vol. 45, No. 2, Mar./Apr. 2009, pp. 694-702.

Yoon et al., "Automated Monitoring of High-Resistance Connections in the Electrical Distribution System of Industrial Facilities," Dept. of Electr. Eng., Korea Univ., Seoul, Industry Applications Society Annual Meeting, 2008, IAS '08, IEEE, pp. 1-8.

Yun et al., "Detection and Classification of Stator Turn Faults and High-Resistance Electrical Connections for Induction Machines," IEEE Transactions on Industry Applications, vol. 45, No. 2, Mar./Apr. 2009, pp. 666-675.

Wu et al., "Improved Online Condition Monitoring Using Static Eccentricity-Induced Negative Sequence Current Information in Induction Machines," Sch. of Electr. & Comput. Eng., Georgia Inst. of Technol., Atlanta, GA, USA, 31st Annual Conference of IEEE Industrial Electronics Society, 2005, IECON 2005, pp. 1737-1742.

* cited by examiner

SYSTEM AND METHOD FOR DETECTING EXCESS VOLTAGE DROP IN THREE-PHASE AC CIRCUITS

BACKGROUND OF THE INVENTION

The present invention relates generally to three-phase alternating current (AC) circuits and, more particularly, to a system and method for detecting excess voltage drop in three-phase AC circuits.

In industrial facilities, electrical machines such as generators, AC motors, and/or transformers are used in various applications. As one example, induction motors are used for applications like pumping, cooling, material movement, and other applications where cost-efficient and robust motors are required. An electrical distribution system is used in conjunction with electrical machines in such applications, with the electrical distribution system including protection and control components such as breakers, contactors, starters, etc.

In providing connections between an electrical distribution system and an electrical machine, it is recognized that an improper connection of protection and/or control components can lead to over-heated contacts that can lead to fire, equipment damage, and process downtime and efficiency loss. That is, excess voltage drops can occur in distribution circuits when electrical connections become loose or have less wire binding force, with such voltage drops leading to abnormal power dissipation at the connections and correspondingly to over-heated contacts or hot spots in the connections that can initiate fire and equipment damage. Even at an early stage, the voltage drops lead to energy losses as line drops, in effect reducing motor efficiency and motor life for example.

Often, the problem of improper electrical connections is addressed to a certain extent by performing preventative maintenance, like annual retorquing of connections or by periodic inspection of all the electrical connections when the distribution circuit is offline. With respect to inspection of the electrical connections, such inspections are typically performed via separate dedicated sensing devices that inspect the electrical distribution system using acoustic or temperature sensing. For example, infrared (IR) scanners are often used to perform a periodic thermal inspection of the electrical distribution system. While effective, the inspection of electrical distribution system by way of such IR scanner is an intensive procedure that can be quite costly. Additionally, the inspection of an electrical distribution system by way of an IR scanner does not provide for online monitoring of the electrical connections.

It would therefore be desirable to provide a system and method that detects excess voltage drops in a distribution circuit in an efficient and cost effective manner, so as to identify improper electrical connections in the circuit. It would also be desirable for such a system and method to be non-intrusive, such that the detection of excess voltage drops in a distribution circuit can be performed while the circuit is online.

BRIEF DESCRIPTION OF THE INVENTION

The present invention provides a system and method for detecting excess voltage drops in three-phase AC circuits.

In accordance with one aspect of the present invention, an electrical distribution circuit includes an input connectable to an AC source, a three-phase output connectable to terminals of an electrical machine to provide three-phase voltages and currents to the electrical machine, one or more circuit components positioned between the input and the output configured to control three-phase voltages and currents to the output, and a diagnostic system configured to detect an excess voltage drop (EVD) fault in the electrical distribution circuit, the diagnostic system comprising a processor that is programmed to receive three-phase voltages and currents provided to the terminals of the electrical machine, determine fundamental components of the three-phase voltages and currents provided to the terminals, compute a positive sequence current, negative sequence current, and zero sequence current from the fundamental components of the three-phase currents, extract a compensated negative sequence current from the negative sequence current component, add the compensated negative sequence current to the positive sequence current to determine fault reference current phasors, determine a negative current reference phase angle for each phase based in part on a phase angle of the positive sequence current, and identify an EVD fault in the electrical distribution circuit based on the compensated negative sequence current, the fault reference current phasors, and the negative current reference phase angles.

In accordance with another aspect of the invention, a method for detecting an excess voltage drop (EVD) fault in a electrical distribution circuit includes measuring three-phase voltages and currents provided to terminals of an electrical machine in the electrical distribution circuit by way of voltage and current sensors and causing a diagnostic system to detect an EVD fault in the electrical distribution circuit based on the measured three-phase voltages and currents. In causing the diagnostic system to detect the EVD fault, the method further includes receiving the measured three-phase voltages and currents provided to the terminals of the electrical machine, analyzing the three-phase voltages and currents to determine fundamental components of the three-phase voltages and currents, computing a positive sequence current, negative sequence current, and zero sequence current from the fundamental components of the three-phase currents, extracting a compensated negative sequence current from the negative sequence current component, adding the compensated negative sequence current to the positive sequence current to determine fault reference current phasors, determining a negative current reference phase angle for each phase based in part on an angle of the positive sequence current, and identifying an EVD fault in the electrical distribution circuit based on the compensated negative sequence current, the fault reference current phasors, and the negative current reference phase angles.

In accordance with yet another aspect of the invention, a diagnostic system configured to detect an excess voltage drop (EVD) fault in a electrical distribution circuit includes a processor programmed to receive three-phase voltages and currents provided to terminals of an electrical machine connected to the electrical distribution circuit, determine fundamental components of the three-phase voltages and currents provided to the terminals, and compute a positive sequence current, negative sequence current, and zero sequence current from the fundamental components of the three-phase currents. The processor is further programmed to extract a compensated negative sequence current from the negative sequence current component, determine fault reference current phasors based on the compensated negative sequence current and the positive sequence current, identify an EVD fault in the electrical distribution circuit based on the compensated negative sequence current and the fault reference current phasors, and localize the EVD fault to one of a first phase, a second phase, and a third phase in the three-phase output. In localizing the EVD fault, the processor is further programmed to determine a phase angle of the compensated negative sequence current, determine negative sequence current reference phase angles for each of the first phase, the second phase, and the third phase based in part on a phase angle of the positive sequence current, determine a minimum difference between the phase angle of the compensated negative sequence current and one of the negative sequence current reference phase angles for the first phase, the second phase, and the third phase, and localize the EVD fault to one of the first phase, the second phase, and the third phase based on the determined minimum difference.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENTS

The embodiments of the invention set forth herein relate to a system and method for detecting excess voltage drops in three-phase AC circuits.

Figure 1:
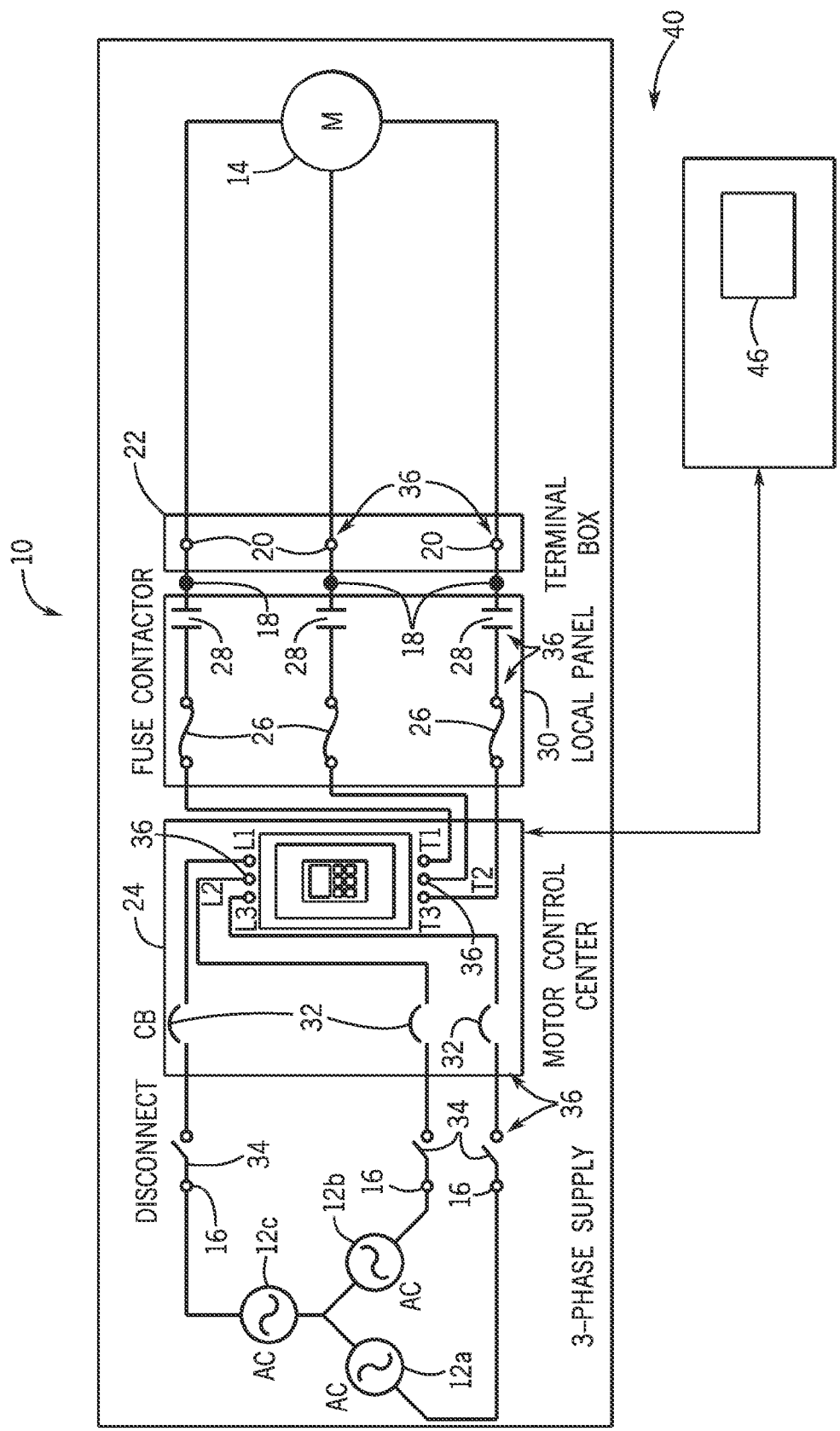
FIG. 1 is a schematic view of a three-phase electrical distribution circuit for use with embodiments of the present invention.

Referring to FIG. 1, a three-phase electrical distribution circuit 10 is shown according to an embodiment of the invention. The electrical distribution circuit 10 is connected between a three-phase AC input 12a-12c and a load 14, such as an AC electrical machine, to provide protection to the electrical machine and to condition power from the three-phase AC input 12a-12c for delivery to the machine. According to one embodiment of the invention, the electrical machine 14 is in the form of an induction motor 14, and thus is referred to hereafter in FIG. 1 as induction motor 14. However, it is recognized that the electrical machine 14 could also be a generator or transformer, for example, or any other load that might be driven by a three-phase power and useful in an industrial setting.

The electrical distribution circuit 10 includes an input 16 that is connectable to three-phase AC input 12a-12c to receive power therefrom. The electrical distribution circuit 10 also includes a three-phase output 18 that is connectable to motor terminals 20 of the induction motor to provide three-phase voltages and currents to the induction motor 14. According to one embodiment, the output 18 can be connected to motor terminals 20 at a terminal box 22 of the electrical distribution circuit 10, for example.

As further shown in FIG. 1, a plurality of circuit components are included in electrical distribution circuit 10 that are positioned between the input 16 and the output 18—with the circuit components providing protection from and control of voltage and current that is provided from the three-phase AC input 12a-12c for delivery to the induction motor 14. A number of such protection and control components are shown in FIG. 1, but it is recognized that other components could also/instead be included in electrical distribution circuit 10 according to embodiments of the invention. In the embodiment of electrical distribution circuit 10 shown in FIG. 1, a motor control center (MCC) 24 is shown as being included in the circuit. The motor control center 24 may comprise an assembly of one or more enclosed sections having a common power bus and containing a number of motor control units—such as a number of motor starters. The motor control center 24 can also include variable frequency drives, programmable controllers, and metering. Associated with operation of the motor control center 24 are a number of protection components/devices to protect the motor 14, provide short-circuit protection, and/or isolate the motor circuit. For example, fuses 26 and contactors 28 are provided in the electrical distribution circuit 10, such as in a local electrical panel 30, to provide for short-circuit protection and control of the induction motor 14. A circuit breaker 32 and disconnect switch 34 are also provided to provide short-circuit protection and isolation of the motor circuit 10.

It is recognized that the electrical distribution circuit 10 shown in FIG. 1 is merely illustrative of a motor electrical distribution circuit that may be associated with an embodiment of the present invention, and that three-phase AC circuits of various configurations and arrangements could instead be provided according to embodiments of the invention.

With respect to the electrical distribution circuit 10 shown in FIG. 1, a plurality of electrical connections, generally referenced as 36, is made in the circuit to connect components 24, 26, 28, 32, 34 therein to one another and to the induction motor 14. In making such connections, it is recognized that an improper connection of protection and/or control components can lead to over-heated contacts that can lead to fire, equipment damage, and process downtime and efficiency loss. That is, excess voltage drops (EVD) can occur in motor circuits when electrical connections 36 become loose or have less wire binding force, with such voltage drops leading to abnormal power dissipation at the connections and correspondingly to over-heated contacts or hot spots in the connections that can initiate fire and equipment damage, energy losses as line drops, motor efficiency loss, and motor life reduction.

Accordingly, a diagnostic system 40 is included in the electrical distribution circuit 10 to detect an excess voltage drop (EVD) fault in the electrical distribution circuit 10, according to an embodiment of the invention. The diagnostic system 40 receives an input regarding the three-phase voltage and current provided to the induction motor 14. According to an exemplary embodiment, the diagnostic system 40 receives voltage and current measurements acquired from voltage and current sensors integrated into a motor starter(s) in the MCC 24; however, it is recognized that separate dedicated voltage and current sensors could be included in electrical distribution circuit 10 to acquire voltage and current data and provide it to diagnostic system 40. As shown in FIG. 1, a processor 46 in the diagnostic system 40 receives the measured three-phase voltages and currents and is programmed to analyze the data to identify an EVD fault in the electrical distribution circuit 10.

Figure 2:
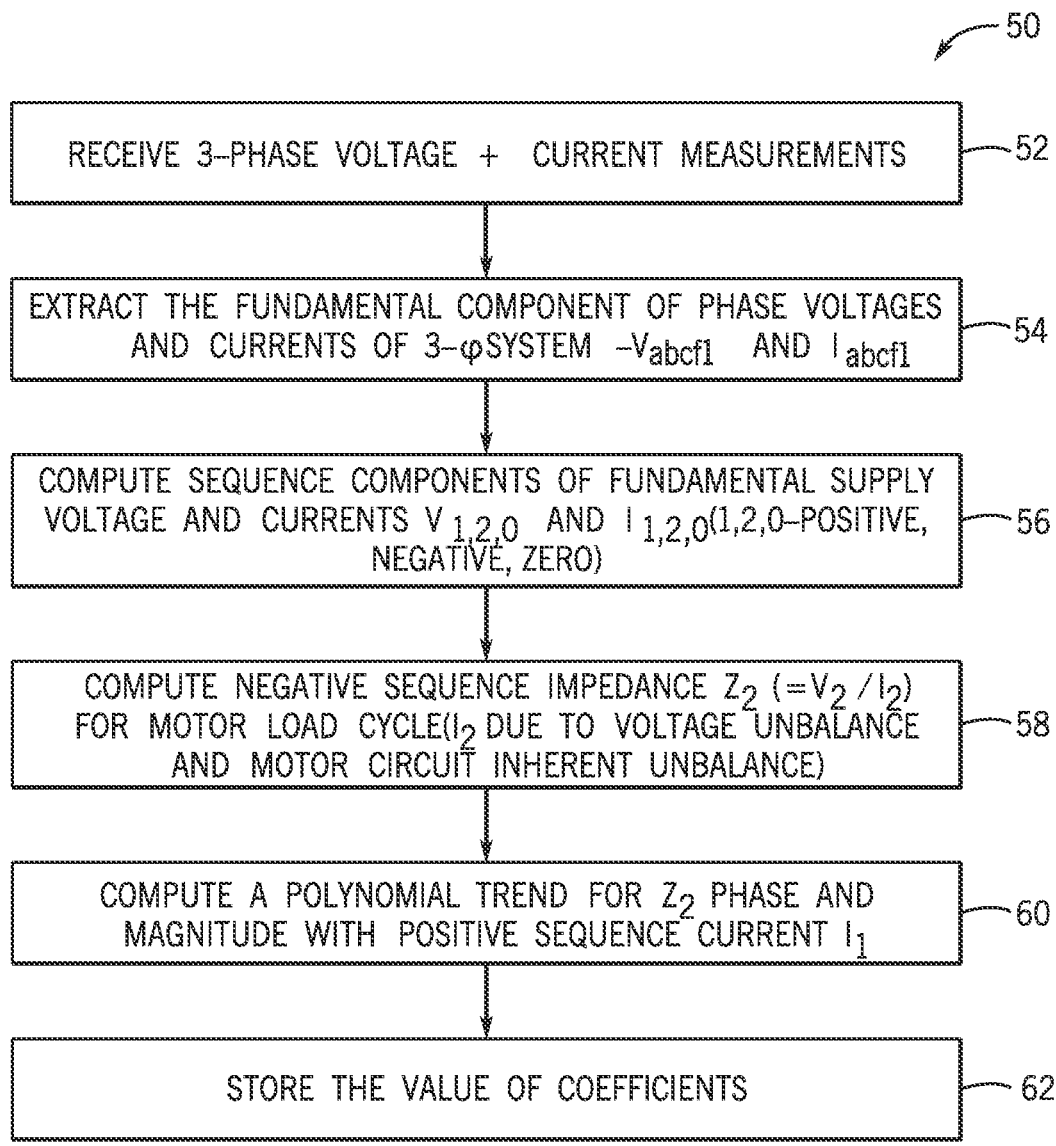
FIGS. 2-5 are flowcharts illustrating a technique for detecting excess voltage drops in three-phase AC circuits according to an embodiment of the invention.

Referring now to FIGS. 2-5, and with continued reference to FIG. 1, a technique 50 is illustrated that is implemented by the processor 46 of diagnostic system 40 to identify the presence of an EVD fault in the electrical distribution circuit 10, according to an embodiment of the invention. Referring first to FIG. 2, which is generally referred to as an "initialization—impedance calculation" phase of the technique 50, three-phase current and voltage measurements are received by the processor 46 at STEP 52. According to an exemplary embodiment, the processor 46 receives three-phase current and voltage data as measured in the MCC, with the voltages and currents from the MCC 24 being subsequently supplied to the terminals 20 of the electrical machine 14—such as an induction motor, for example. Upon receiving the three-phase current and voltage measurements, the processor 46 then extracts the fundamental components of the three-phase currents and voltages at STEP 54, with the fundamental voltages and currents identified as $V_{abc\_fl}$ and $I_{abc\_fl}$, respectively.

As shown in FIG. 2, the technique 50 continues with the computing of sequence components of the fundamental supply voltages and currents at STEP 56, with the sequence components of the voltages and currents being identified as $V_{1,2,0}$ and $I_{1,2,0}$, with the positive, negative and zero sequence components being identified by 1, 2, and 0, respectively. With respect to the current sequence components, the sequence components of the motor currents are computed using:

$$\begin{bmatrix} I_0 \\ I_1 \\ I_2 \end{bmatrix} = \frac{1}{3} \begin{bmatrix} 1 & 1 & 1 \\ 1 & a & a^2 \\ 1 & a^2 & a \end{bmatrix} \begin{bmatrix} I_a \\ I_b \\ I_c \end{bmatrix}, \quad [\text{Eqn. 1}]$$

where $I_a$, $I_b$, $I_c$ are the motor phase currents and $I_0$, $I_1$, $I_2$ are the zero, positive, and negative sequence components of the phase currents, and $$a = 1\angle 120 = -0.5 + j\frac{\sqrt{3}}{2}. \quad [\text{Eqn. 2}]$$

The technique next estimates a negative sequence impedance $Z_2$ at STEP 58 for a motor load cycle. The negative sequence impedance $Z_2$ can generally be calculated by dividing the negative sequence voltage $\overline{V}_2$ by negative sequence current $\overline{I}_2$ according to:

$$\overline{Z}_2 = \frac{\overline{V}_2}{\overline{I}_2}. \quad [\text{Eqn. 3}]$$

In implementing Eqn. 3, the negative sequence impedance $Z_2$ is calculated using the negative sequence voltage $\overline{V}_2$ and negative sequence current $\overline{I}_2$ under healthy conditions, when all the connections in the electrical distribution circuit 10 are proper, as it is recognized that $\overline{I}_2$ is dependent on voltage unbalance and motor circuit inherent unbalance. Alternative to using Eqn. 3, the negative sequence impedance $Z_2$ could be estimated using another known method.

As stated above, the negative sequence impedance $Z_2$ is determined at STEP 58 for a motor load cycle, as it is recognized that the impedance varies with load current and motor slip—and thus a number of impedance values over the range of the load cycle are acquired.

Upon determination of the negative sequence impedance $Z_2$, the technique 50 continues at STEP 60 with the computing of a polynomial trend for a phase and magnitude of the negative sequence impedance $Z_2$ using the positive sequence current $\overline{I}_1$. That is, it is recognized that the negative sequence impedance $Z_2$ varies with slip of motor. As such, data is collected at different slips (i.e., different loading conditions) regarding the variation of $Z_2$ versus % load. After getting this variation, an equation of the curve/line describing the variation is found. The equation $y=f(x)$ is solved by employing a third order fit according to:

$$y = a_1 * X^3 + a_2 * X^2 + a_3 * X + a_4 \quad [\text{Eqn. 4}],$$

where X is the positive sequence current load $I_1$ flowing in the circuit and y is the negative sequence impedance $Z_2$ value. Polynomial order can change according to data behavior. Such equations are provided and solved for both magnitude and phase curves. The values determined for the coefficients of the magnitude and phase of the negative sequence impedance $Z_2$ at STEP 60 are then stored at STEP 62 for later use and, when additional data is collected, values of y for both magnitude and phase are again computed.

Figure 3:
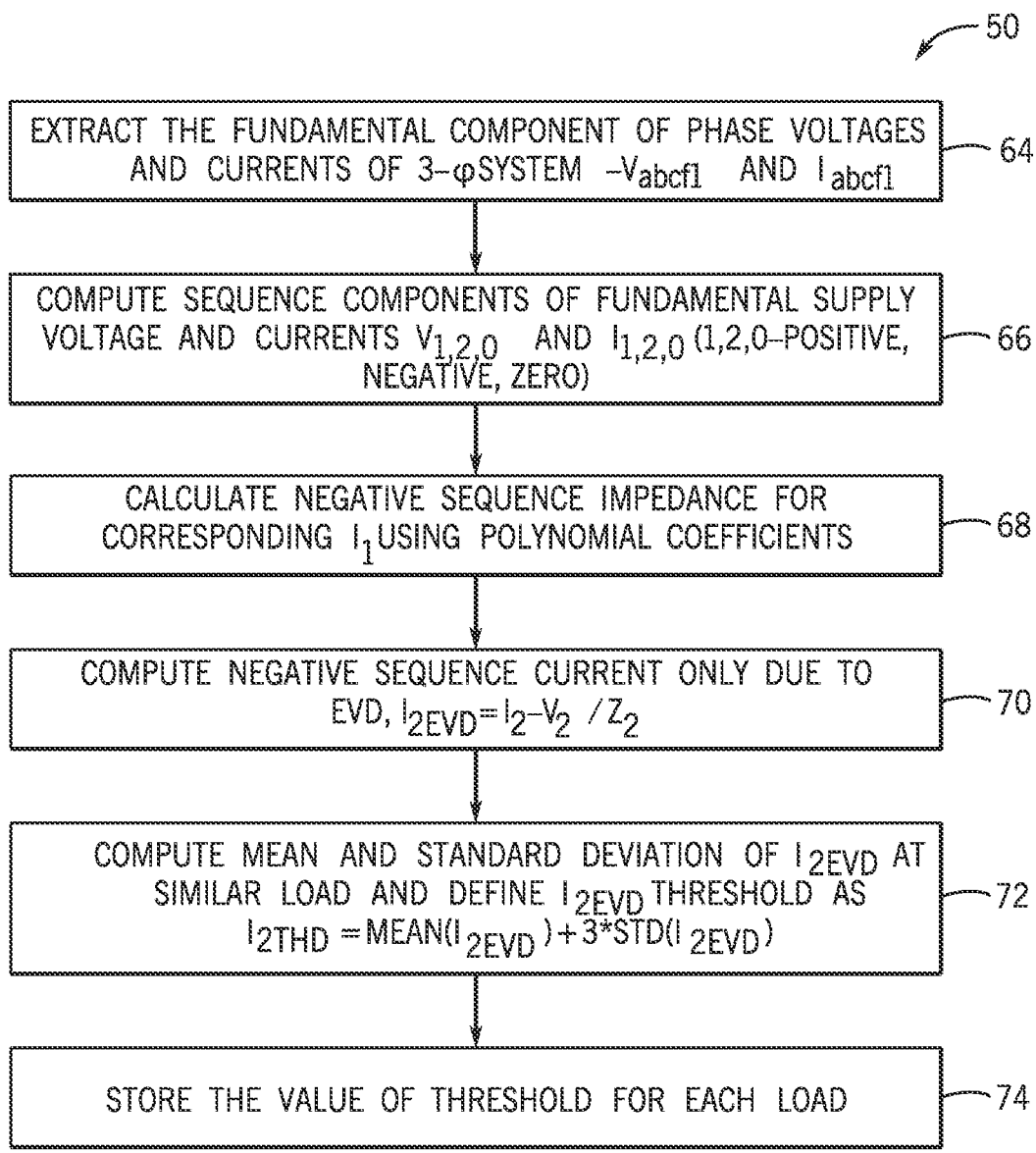

Referring now to FIG. 3, which is generally referred to as an "initialization—threshold calculation" phase of the technique 50, extraction of the fundamental components of the three-phase currents and voltages $V_{abc\_fl}$ and $I_{abc\_fl}$ and computing of positive, negative and zero sequence components of the fundamental supply voltages and currents $V_{1,2,0}$ and $I_{1,2,0}$, are first determined at STEPS 64 and 66. The extraction and computing performed at STEPS 64 and 66 mirrors that done at STEPS 54 and 56, as described in detail above with respect to FIG. 2. The technique 50 continues at STEP 68, where a negative sequence impedance $Z_2$ is calculated for a corresponding positive sequence current $\overline{I}_1$ using the polynomial coefficients stored at STEP 62 (FIG. 2).

It is recognized that the magnitude and angle of the negative sequence component of the current, $\overline{I}_2$, is dependent on supply voltage, line impedances motor impedance, motor windings, and motor faults like turn faults—which are generally termed here as collectively generating an "extraneous negative sequence current component." In order to isolate the contribution of an EVD fault to the negative sequence component of the current $\overline{I}_2$, the contribution of the EVD to the negative sequence current component $\overline{I}_2$ needs to be extracted therefrom—i.e., separated from the contribution of the extraneous negative sequence current component. To accomplish this, the contribution of the other possible causes needs to be subtracted from $\overline{I}_2$. The component of the negative sequence current $\overline{I}_2$ that is solely due to EVD is called the "compensated negative sequence current", $\overline{I}_{2EVD}$, and is described as:

$$\overline{I}_{2EVD} = \overline{I}_2 - \overline{I}_{2nf} \quad [\text{Eqn. 5}].$$

where $I_{2nf}$ is the extraneous negative sequence current component, which quantifies the negative sequence current due to unbalance in supply voltage, line impedances, motor windings and motor faults like turn faults. In the absence of motor faults causing unbalance, the extraneous negative sequence current component due to noise factors is given by:

$$\overline{I}_{2nf} = \overline{I}_{2Vun} \quad [\text{Eqn. 6}].$$

Thus, Eqn. 6 can be rewritten as:

$$\overline{I}_{2EVD} = \overline{I}_2 - \overline{I}_{2Vun} \quad [\text{Eqn. 7}].$$

The extraneous negative sequence current component due to noise factors $\overline{I}_{2nVun}$ can be rewritten as being derived from the negative sequence voltage $\overline{V}_2$ and negative sequence impedance $Z_2$ under healthy conditions as:

$$\overline{I}_{2Vun} = \frac{\overline{V}_2}{\overline{Z}_2}, \quad [\text{Eqn. 8}]$$

Therefore, the component of the negative sequence current $\overline{I}_2$ that is solely due to EVD—the compensated negative sequence current $\overline{I}_{2EVD}$—can be calculated at STEP 70 according to:

$$\overline{I_{2EVD}} = \overline{I_2} - \frac{\overline{V_2}}{\overline{Z_2}}.$$  [Eqn. 9]

For a particular load condition, at least ten instances are recorded in healthy condition and such instances are recorded for different load conditions and following computations are performed. For each instance the compensated negative sequence current, $\overline{I_{2EVD}}$ is computed. At STEP 72, for instances of one load condition, mean and standard deviation of the compensated negative sequence current $\overline{I_{2EVD}}$ is computed. Similar calculations are made for each load condition. A threshold for an EVD component of negative sequence current, $I_{2THD}$, (i.e., the threshold compensated negative sequence current) is defined at STEP 72. $I_{2THD}$ is defined according to:

$I_{2THD} = \text{mean}(I_{2EVD}) + 3 * \text{std}(I_{2EVD})$  [Eqn. 10].

The value of $I_{2THD}$ for each load in the motor load cycle is then stored at STEP 74.

Figure 4:
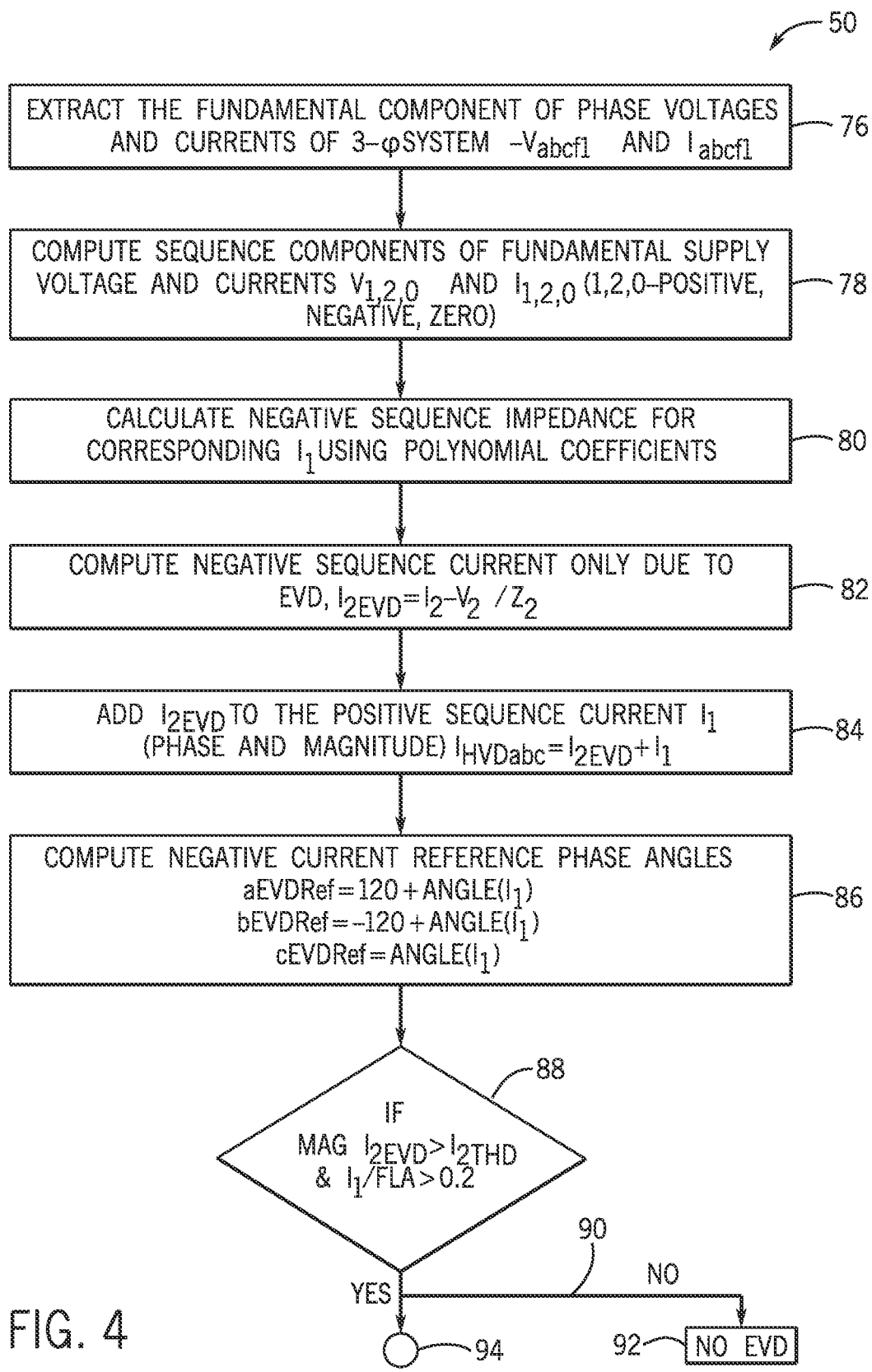
Figure 5:
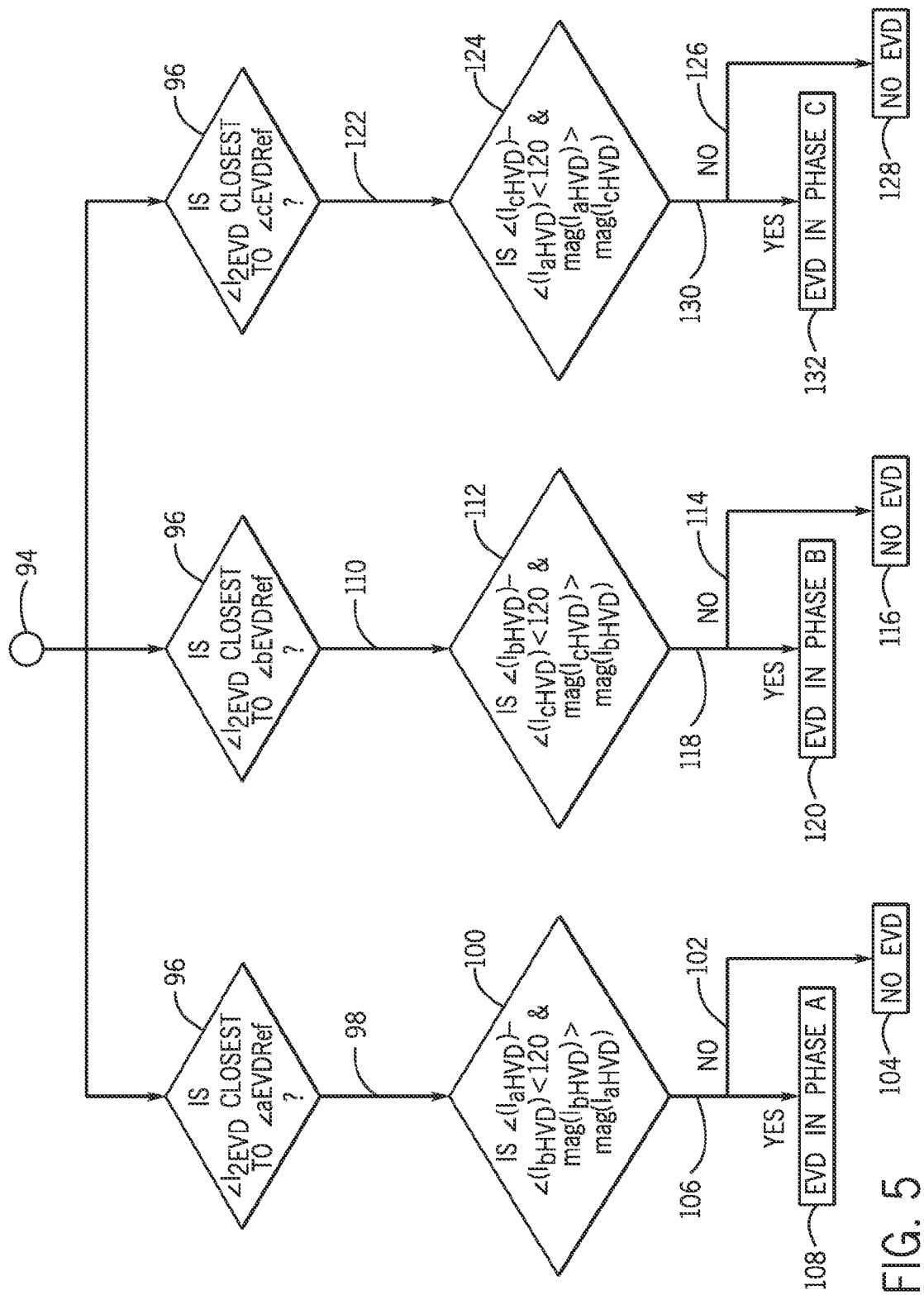

Referring now to FIGS. 4 and 5, which are generally referred to as a "fault detection" phase of the technique 50, extraction of the fundamental components of the three-phase currents and voltages $V_{abc\_fl}$ and $I_{abc\_fl}$, computing of positive, negative and zero sequence components of the fundamental supply voltages and currents $V_{1,2,0}$ and $I_{1,2,0}$, calculation of the negative sequence impedance $Z_2$ is calculated for a corresponding positive sequence current $\overline{I_1}$ using the polynomial coefficients stored at STEP 62 (FIG. 2), and computing of the compensated negative sequence current $\overline{I_{2EVD}}$ are first determined at STEPS 76, 78, 80, and 82, with the performing of STEPS 76, 78, 80, and 82 mirroring those of STEPS 54/64, 56/66, 68, and 70, as described in detail above with respect to FIGS. 2 and 3.

The technique 50 then continues at STEP 84, where the compensated negative sequence current $\overline{I_{2EVD}}$ is added to the positive sequence current $\overline{I_1}$ (phase and magnitude), with the resulting fault reference current phasors being described by:

$I_{HVDabc} = I_{2EVD} + I_1$  [Eqn. 11].

As shown in FIG. 4, the technique 50 continues by computing negative sequence current reference phase angles $\text{angl}_{aEVD\_Ref}$, $\text{angl}_{bEVD\_Ref}$, $\text{angl}_{cEVD\_Ref}$ at STEP 86. According to an exemplary embodiment, the negative sequence current reference phase angles computed at STEP 86 are derived in part by using the phase angle of the positive sequence $I_1$ current according to:

$\text{angl}_{aEVD\_Ref} = 120 + \text{angl}(I_1)$ $\text{angl}_{bEVD\_Ref} = -120 + \text{angl}(I_1)$ $\text{angl}_{cEVD\_Ref} = \text{angl}(I_1)$  [Eqn. 12].

The fault detection portion of technique 50 continues at STEP 88, where it is determined whether the magnitude of the compensated negative sequence current $\overline{I_{2EVD}}$ is greater than the threshold compensated negative sequence current $I_{2THD}$ and whether the value of the positive sequence current $I_1$ is greater than 20% of the total full load current. If it is determined at STEP 88 that either the magnitude of the compensated negative sequence current $\overline{I_{2EVD}}$ is less than the threshold compensated negative sequence current $I_{2THD}$ or the value of the positive sequence current $I_1$ is less than 20% of the total full load current, as indicated at 90, then it is determined that there is no EVD in the system, as indicated at STEP 92.

Conversely, if it is determined at STEP 88 that the magnitude of the compensated negative sequence current $\overline{I_{2EVD}}$ is greater than the threshold compensated negative sequence current $I_{2THD}$ and that the value of the positive sequence current $I_1$ is greater than 20% of the total full load current, as indicated at 94, then the technique continues at STEP 96, where a minimum difference between the angle of the compensated negative sequence current $\angle \overline{I_{2EVD}}$, and the negative sequence current reference phase angles $\text{angl}_{aEVD\_Ref}$, $\text{angl}_{bEVD\_Ref}$, $\text{angl}_{cEVD\_Ref}$ determined at STEP 86. That is, the angle of the compensated negative sequence current $\angle \overline{I_{2EVD}}$, is compared simultaneously to each of the negative sequence current reference angles $\text{angl}_{aEVD\_Ref}$, $\text{angl}_{bEVD\_Ref}$, $\text{angl}_{cEVD\_Ref}$ at STEP 96 to determine which of the negative sequence current reference angles $\text{angl}_{aEVD\_Ref}$, $\text{angl}_{bEVD\_Ref}$, $\text{angl}_{cEVD\_Ref}$ the angle of the compensated negative sequence current $\angle \overline{I_{2EVD}}$ is closest to.

If it is determined at STEP 96 that the angle of the compensated negative sequence current $\angle \overline{I_{2EVD}}$ is closest to the negative sequence current reference angle on Phase A $\text{angl}_{aEVD\_Ref}$ as indicated at 98, then a determination is made at STEP 100 whether the angle of the fault reference current phasor on Phase A, $\text{angl}(I_{aHVD})$, (as determined at STEP 84 by Eqn. 12) minus the angle of the fault reference current phasor on Phase B, $\text{angl}(I_{bHVD})$, (as determined at STEP 84 by Eqn. 12) is less than 120 degrees—i.e., is $\text{angl}(I_{aHVD}) - \text{angl}(I_{bHVD}) < 120°$. A determination is also made at STEP 100 whether the magnitude of the fault reference current phasor on Phase B is greater than the magnitude of the fault reference current phasor on Phase A—i.e., is $\text{mag}(I_{bHVD}) > \text{mag}(I_{aHVD})$. If $\text{angl}(I_{aHVD})$ minus $\text{angl}(I_{bHVD})$, is greater than 120 degrees or $\text{mag}(I_{bHVD})$ is less than $\text{mag}(I_{aHVD})$, as indicated at 102, then it is determined that there is no EVD in the system, as indicated at STEP 104. Conversely, if $\text{angl}(I_{aHVD})$ minus $\text{angl}(I_{bHVD})$ is less than 120 degrees and $\text{mag}(I_{bHVD})$ is greater than $\text{mag}(I_{aHVD})$, as indicated at 106, then it is determined that there is an EVD on Phase A, as indicated at STEP 106.

If it is determined at STEP 96 that the angle of the compensated negative sequence current $\angle \overline{I_{2EVD}}$ is closest to the negative current reference angle on Phase B $\text{angl}_{bEVD\_Ref}$ as indicated at 110, then a determination is made at STEP 112 whether the angle of the fault reference current phasor on Phase B, $\text{angl}(I_{bHVD})$, (as determined at STEP 84 by Eqn. 12) minus the angle of the fault reference current phasor on Phase C, $\text{angl}(I_{cHVD})$, (as determined at STEP 84 by Eqn. 12) is less than 120 degrees—i.e., is $\text{angl}(I_{bHVD}) - \text{angl}(I_{cHVD}) < 120'$. A determination is also made at STEP 112 whether the magnitude of the fault reference current phasor on Phase C is greater than the magnitude of the fault reference current phasor on Phase B—i.e., is $\text{mag}(I_{cHVD}) > \text{mag}(I_{bHVD})$. If $\text{angl}(I_{bHVD})$, minus $\text{angl}(I_{cHVD})$, is greater than 120 degrees or $\text{mag}(I_{cHVD})$ is less than $\text{mag}(I_{bHVD})$, as indicated at 114, then it is determined that there is no EVD in the system, as indicated at STEP 116. Conversely, if $\text{angl}(I_{bHVD})$ minus $\text{angl}(I_{cHVD})$ is less than 120 degrees and $\text{mag}(I_{cHVD})$ is greater than $\text{mag}(I_{bHVD})$, as indicated at 118, then it is determined that there is an EVD on Phase B, as indicated at STEP 120.

If it is determined at STEP 96 that the angle of the compensated negative sequence current $\angle \overline{I_{2EVD}}$ is closest to the negative current reference angle on Phase C $\text{angl}_{cEVD\_Ref}$ as indicated at 122, then a determination is made at STEP 124 whether the angle of the fault reference current phasor on Phase C, $\text{angl}(I_{cHVD})$, (as determined at STEP 84 by Eqn. 12) minus the angle of the fault reference current phasor on Phase A, $\text{angl}(I_{aHVD})$, (as determined at STEP 84 by Eqn. 12) is less than 120 degrees—i.e., is $\text{angl}(I_{cHVD}) - \text{angl}(I_{aHVD}) < 120'$. A determination is also made at STEP 124 whether the magnitude of the fault reference current phasor on Phase A is greater than the magnitude of the fault reference current phasor on Phase C—i.e., is mag($I_{aHVD}$)>mag($I_{cHVD}$). If angl($I_{cHVD}$) minus angl($I_{aHVD}$) is greater than 120 degrees or mag($I_{aHVD}$) is less than mag($I_{cHVD}$), as indicated at 126, then it is determined that there is no EVD in the system, as indicated at STEP 128. Conversely, if angl($I_{cHVD}$) minus angl($I_{aHVD}$) is less than 120 degrees and mag($I_{aHVD}$) is greater than mag ($I_{cHVD}$), as indicated at 130, then it is determined that there is an EVD on Phase C, as indicated at STEP 132.

Beneficially, embodiments of the invention thus provide a system and method for detecting EVD faults in three-phase AC motor circuits by using the motor three-phase voltages and currents. As EVD in three-phase motor circuits leads to voltage unbalance at the motor terminals and consequent current unbalance, an EVD fault can be detected via the analysis and processing of measured three-phase voltages and currents. As a rule of thumb, a 1% voltage unbalance in supply could lead to 6-10% unbalance in motor current—and thus even small voltage drops in the range of 40-300 mV can lead to appreciable current unbalance leading to detection of the voltage drop. The current unbalance can be analyzed such that the effects of noise factors like supply unbalance, motor faults and motor intrinsic unbalance are accounted for, such that an EVD fault can be accurately diagnosed.

A technical contribution for the disclosed method and apparatus is that it provides for a processor-implemented technique for detecting excess voltage drops in three-phase AC motor circuits.

Therefore, according to one embodiment of the present invention, an electrical distribution circuit includes an input connectable to an AC source, a three-phase output connectable to terminals of an electrical machine to provide three-phase voltages and currents to the electrical machine, one or more circuit components positioned between the input and the output configured to control three-phase voltages and currents to the output, and a diagnostic system configured to detect an excess voltage drop (EVD) fault in the electrical distribution circuit, the diagnostic system comprising a processor that is programmed to receive three-phase voltages and currents provided to the terminals of the electrical machine, determine fundamental components of the three-phase voltages and currents provided to the terminals, compute a positive sequence current, negative sequence current, and zero sequence current from the fundamental components of the three-phase currents, extract a compensated negative sequence current from the negative sequence current component, add the compensated negative sequence current to the positive sequence current to determine fault reference current phasors, determine a negative current reference phase angle for each phase based in part on a phase angle of the positive sequence current, and identify an EVD fault in the electrical distribution circuit based on the compensated negative sequence current, the fault reference current phasors, and the negative current reference phase angles.

According to another embodiment of the present invention, a method for detecting an excess voltage drop (EVD) fault in a electrical distribution circuit includes measuring three-phase voltages and currents provided to terminals of an electrical machine in the electrical distribution circuit by way of voltage and current sensors and causing a diagnostic system to detect an EVD fault in the electrical distribution circuit based on the measured three-phase voltages and currents. In causing the diagnostic system to detect the EVD fault, the method further includes receiving the measured three-phase voltages and currents provided to the terminals of the electrical machine, analyzing the three-phase voltages and currents to determine fundamental components of the three-phase voltages and currents, computing a positive sequence current, negative sequence current, and zero sequence current from the fundamental components of the three-phase currents, extracting a compensated negative sequence current from the negative sequence current component, adding the compensated negative sequence current to the positive sequence current to determine fault reference current phasors, determining a negative current reference phase angle for each phase based in part on an angle of the positive sequence current, and identifying an EVD fault in the electrical distribution circuit based on the compensated negative sequence current, the fault reference current phasors, and the negative current reference phase angles.

According to yet another embodiment of the present invention, a diagnostic system configured to detect an excess voltage drop (EVD) fault in a electrical distribution circuit includes a processor programmed to receive three-phase voltages and currents provided to terminals of an electrical machine connected to the electrical distribution circuit, determine fundamental components of the three-phase voltages and currents provided to the terminals, and compute a positive sequence current, negative sequence current, and zero sequence current from the fundamental components of the three-phase currents. The processor is further programmed to extract a compensated negative sequence current from the negative sequence current component, determine fault reference current phasors based on the compensated negative sequence current and the positive sequence current, identify an EVD fault in the electrical distribution circuit based on the compensated negative sequence current and the fault reference current phasors, and localize the EVD fault to one of a first phase, a second phase, and a third phase in the three-phase output. In localizing the EVD fault, the processor is further programmed to determine a phase angle of the compensated negative sequence current, determine negative sequence current reference phase angles for each of the first phase, the second phase, and the third phase based in part on a phase angle of the positive sequence current, determine a minimum difference between the phase angle of the compensated negative sequence current and one of the negative sequence current reference phase angles for the first phase, the second phase, and the third phase, and localize the EVD fault to one of the first phase, the second phase, and the third phase based on the determined minimum difference.

The present invention has been described in terms of the preferred embodiment, and it is recognized that equivalents, alternatives, and modifications, aside from those expressly stated, are possible and within the scope of the appending claims.

What is claimed is:
1. An electrical distribution circuit comprising:
an input connectable to an AC source;
a three-phase output connectable to terminals of an electrical machine, the three-phase output configured to provide three-phase voltages and currents to the electrical machine;
one or more circuit components positioned between the input and the output configured to control three-phase voltages and currents to the output; and
a diagnostic system configured to detect an excess voltage drop (EVD) fault in the electrical distribution circuit, the diagnostic system comprising a processor that is programmed to:
receive three-phase voltages and currents provided to the terminals of the electrical machine;
determine fundamental components of the three-phase voltages and currents provided to the terminals;

compute a positive sequence current, negative sequence current, and zero sequence current from the fundamental components of the three-phase currents;

extract a compensated negative sequence current from the negative sequence current component;

add the compensated negative sequence current to the positive sequence current to determine fault reference current phasors;

determine a negative current reference phase angle for each phase based in part on a phase angle of the positive sequence current; and identify an EVD fault in the electrical distribution circuit based on the compensated negative sequence current, the fault reference current phasors, and the negative current reference phase angles.

2. The electrical distribution circuit of claim 1 wherein, in extracting the compensated negative sequence current from the negative sequence current, the processor is further programmed to:

determine an extraneous negative sequence current component in the negative sequence current, the extraneous negative sequence current component comprising a negative sequence current resulting from at least one of an unbalanced supply voltage and circuit intrinsic imbalance; and subtract the extraneous negative sequence current component from the negative sequence current to determine the compensated negative sequence current.

3. The electrical distribution circuit of claim 2 wherein, in determining the extraneous negative sequence current component, the processor is further programmed to determine the extraneous negative sequence current component based on a negative sequence voltage component from the fundamental components of the three-phase voltages and based on a negative sequence impedance.

4. The electrical distribution circuit of claim 3 wherein the processor is further programmed to calculate the negative sequence impedance using a negative sequence voltage and a negative sequence current acquired during operation of the electrical machine in a healthy state.

5. The electrical distribution circuit of claim 1 wherein the processor is further programmed to:

determine mean and standard deviation values of the compensated negative sequence current; and determine a compensated negative sequence current threshold based on the determined mean and standard deviation values of the compensated negative sequence current.

6. The electrical distribution circuit of claim 5 wherein, in identifying an EVD fault, the processor is further programmed to:

compare the extracted compensated negative sequence current to the compensated negative sequence current threshold;

compare the positive sequence current to a full load current of the electrical machine; and if the extracted compensated negative sequence current is greater than the compensated negative sequence current threshold and the positive sequence current is greater than a pre-determined percentage of the full load current of the electrical machine, then declare an EVD in the electrical distribution circuit;

otherwise, determine that there is no EVD in the in the electrical distribution circuit.

7. The electrical distribution circuit of claim 1 wherein the processor is further programmed to localize the EVD fault to one of a first phase, a second phase, and a third phase in the three-phase output, and wherein in localizing the EVD fault to one of the first phase, the second phase, and the third phase, the processor is further programmed to:

determine a phase angle of the compensated negative sequence current;

compare the phase angle of the compensated negative sequence current to the negative sequence current reference phase angle for each of the first phase, the second phase, and the third phase;

determine a minimum difference between the phase angle of the compensated negative sequence current and one of the negative sequence current reference phase angles for the first phase, the second phase, and the third phase; and localize the EVD fault to one of the first phase, the second phase, and the third phase based on the determined minimum difference.

8. The electrical distribution circuit of claim 7 wherein, in localizing the EVD fault to one of the first phase, the second phase, and the third phase, the processor is further programmed to:

compare an angle of the fault reference current phasor for one of the first phase, the second phase, and the third phase to the angle of the fault reference current phasor for another of the first phase, the second phase, and the third phase;

compare a magnitude of the fault reference current phasor for one of the first phase, the second phase, and the third phase to the magnitude of the fault reference current phasor for another of the first phase, the second phase, and the third phase; and determine the presence of an EVD fault in one of the first phase, the second phase, and the third phase based on the comparison of the fault reference current phasor angle and magnitude for one phase to the fault reference current phasor angle and magnitude for another phase.

9. The electrical distribution circuit of claim 8 wherein the processor is further programmed to determine the presence of an EVD fault in one of the first phase, the second phase, and the third phase by verifying that:

$$\text{angl}(I_{n1\_HVD}) - \text{angl}(I_{n2\_HVD}) < 120° \quad \text{and}$$
$$\text{mag}(I_{n2\_HVD}) > \text{mag}(I_{n1\_HVD}),$$

where n1 is a phase identified as having the determined minimum difference between that phase and the phase angle of the compensated negative sequence current and n2 is another phase.

10. The electrical distribution circuit of claim 1 wherein the one or more circuit components comprises at least one of a breaker, contactor, fuse, disconnect, motor control center, soft-starter, or motor drive.

11. The electrical distribution circuit of claim 1 wherein the processor in the diagnostic system receives three-phase voltage and current data acquired by sensors integrated into one of a motor control center, soft-starter, or motor drive.

12. A method for detecting an excess voltage drop (EVD) fault in a electrical distribution circuit, the method comprising:

measuring three-phase voltages and currents provided to terminals of an electrical machine in the electrical distribution circuit by way of voltage and current sensors;

causing a diagnostic system to detect an excess voltage drop (EVD) fault in the electrical distribution circuit based on the measured three-phase voltages and currents, wherein causing the diagnostic system to detect the EVD fault comprises:

receiving the measured three-phase voltages and currents provided to the terminals of the electrical machine;

analyzing the three-phase voltages and currents to determine fundamental components of the three-phase voltages and currents;

computing a positive sequence current, negative sequence current, and zero sequence current from the fundamental components of the three-phase currents;

extracting a compensated negative sequence current from the negative sequence current component;

adding the compensated negative sequence current to the positive sequence current to determine fault reference current phasors;

determining a negative current reference phase angle for each phase based in part on an angle of the positive sequence current; and identifying an EVD fault in the electrical distribution circuit based on the compensated negative sequence current, the fault reference current phasors, and the negative current reference phase angles.

13. The method of claim 12 wherein extracting the compensated negative sequence current further comprises:

determining an extraneous negative sequence current component in the negative sequence current, the extraneous negative sequence current component comprising a negative sequence current resulting from at least one of an unbalanced supply voltage and circuit intrinsic imbalance; and subtracting the extraneous negative sequence current component from the negative sequence current to determine the compensated negative sequence current.

14. The method of claim 12 further comprising:

determining mean and standard deviation values of the compensated negative sequence current;

determining a compensated negative sequence current threshold based on the determined mean and standard deviation values of the compensated negative sequence current;

comparing the extracted compensated negative sequence current to the compensated negative sequence current threshold;

comparing the positive sequence current to a full load current of the electrical machine; and if the extracted compensated negative sequence current is greater than the compensated negative sequence current threshold and the positive sequence current is greater than a pre-determined percentage of the full load current of the electrical machine, then declaring an EVD in the electrical distribution circuit;

otherwise, determining that there is no EVD in the in the electrical distribution circuit.

15. The method of claim 12 further comprising localizing the EVD fault to one of a first phase, a second phase, and a third phase in the three-phase output, wherein localizing the EVD fault comprises:

determining a phase angle of the compensated negative sequence current;

comparing the phase angle of the compensated negative sequence current to the negative sequence current reference phase angle for each of the first phase, the second phase, and the third phase;

determining a minimum difference between the phase angle of the compensated negative sequence current and one of the negative sequence current reference phase angles for the first phase, the second phase, and the third phase; and localizing the EVD fault to one of the first phase, the second phase, and the third phase based on the determined minimum difference.

16. The method of claim 15 wherein localizing the EVD fault further comprises:

comparing an angle of the fault reference current phasor for one of the first phase, the second phase, and the third phase to the angle of the fault reference current phasor for another of the first phase, the second phase, and the third phase;

comparing a magnitude of the fault reference current phasor for one of the first phase, the second phase, and the third phase to the magnitude of the fault reference current phasor for another of the first phase, the second phase, and the third phase; and determining the presence of an EVD fault in one of the first phase, the second phase, and the third phase based on the comparison of the fault reference current phasor angle and magnitude for one phase to the fault reference current phasor angle and magnitude for another phase;

wherein the presence of an EVD fault in one of the first phase, the second phase, and the third phase is determined by verifying that:

$$\text{angl}(I_{n1\_HVD}) - \text{angl}(I_{n2\_HVD}) < 120° \quad \text{and}$$
$$\text{mag}(I_{n2\_HVD}) > \text{mag}(I_{n1\_HVD}),$$

where n1 is a phase identified as having the determined minimum difference between that phase and the phase angle of the compensated negative sequence current and n2 is another phase.

17. A diagnostic system configured to detect an excess voltage drop (EVD) fault in a electrical distribution circuit, the diagnostic system comprising:

a processor programmed to:

receive three-phase voltages and currents provided to terminals of an electrical machine connected to the electrical distribution circuit;

determine fundamental components of the three-phase voltages and currents provided to the terminals;

compute a positive sequence current, negative sequence current, and zero sequence current from the fundamental components of the three-phase currents;

extract a compensated negative sequence current from the negative sequence current component;

determine fault reference current phasors based on the compensated negative sequence current and the positive sequence current;

identify an EVD fault in the electrical distribution circuit based on the compensated negative sequence current and the fault reference current phasors; and localize the EVD fault to one of a first phase, a second phase, and a third phase in the three-phase output, wherein, in localizing the EVD fault, the processor is further programmed to:

determine a phase angle of the compensated negative sequence current;

determine negative sequence current reference phase angles for each of the first phase, the second phase, and the third phase based in part on a phase angle of the positive sequence current;

determine a minimum difference between the phase angle of the compensated negative sequence current and one of the negative sequence current reference phase angles for the first phase, the second phase, and the third phase; and localize the EVD fault to one of the first phase, the second phase, and the third phase based on the determined minimum difference.

18. The diagnostic system of claim 17 wherein, in extracting the compensated negative sequence current from the negative sequence current, the processor is further programmed to:
  determine an extraneous negative sequence current component in the negative sequence current, the extraneous negative sequence current component comprising a negative sequence current resulting from at least one of an unbalanced supply voltage and circuit intrinsic imbalance; and
  subtract the extraneous negative sequence current component from the negative sequence current to determine the compensated negative sequence current.

19. The diagnostic system of claim 18 wherein the processor is further programmed to:
  determine mean and standard deviation values of the compensated negative sequence current; and
  determine a compensated negative sequence current threshold based on the determined mean and standard deviation values of the compensated negative sequence current; and
  wherein, in identifying an EVD fault, the processor is further programmed to:
    compare the extracted compensated negative sequence current to the compensated negative sequence current threshold;
    compare the positive sequence current to a full load current of the electrical machine; and
    if the extracted compensated negative sequence current is greater than the compensated negative sequence current threshold and the positive sequence current is greater than a pre-determined percentage of the full load current of the electrical machine, then declare an EVD in the electrical distribution circuit;
    otherwise, determine that there is no EVD in the in the electrical distribution circuit.

20. The diagnostic system of claim 17 wherein, in localizing the EVD fault to one of the first phase, the second phase, and the third phase, the processor is further programmed to:
  compare an angle of the fault reference current phasor for one of the first phase, the second phase, and the third phase to the angle of the fault reference current phasor for another of the first phase, the second phase, and the third phase;
  compare a magnitude of the fault reference current phasor for one of the first phase, the second phase, and the third phase to the magnitude of the fault reference current phasor for another of the first phase, the second phase, and the third phase; and
  determine the presence of an EVD fault in one of the first phase, the second phase, and the third phase based on the comparison of the fault reference current phasor angle and magnitude for one phase to the fault reference current phasor angle and magnitude for another phase.

\* \* \* \* \*